United States Patent
Lee et al.

(10) Patent No.: US 11,584,993 B2
(45) Date of Patent: Feb. 21, 2023

(54) THERMALLY UNIFORM DEPOSITION STATION

(71) Applicant: Applied Materials, Inc., Santa Clara, CA (US)

(72) Inventors: Jared Ahmad Lee, San Jose, CA (US); Sanjeev Baluja, Campbell, CA (US); Joseph AuBuchon, San Jose, CA (US); Kenneth Brian Doering, San Jose, CA (US); Dhritiman Subha Kashyap, Bangalore (IN); Kartik Shah, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/074,035

(22) Filed: Oct. 19, 2020

(65) Prior Publication Data
US 2022/0119948 A1    Apr. 21, 2022

(51) Int. Cl.
*H01J 37/32* (2006.01)
*C23C 16/455* (2006.01)
*C23C 16/44* (2006.01)

(52) U.S. Cl.
CPC .... *C23C 16/45565* (2013.01); *C23C 16/4412* (2013.01); *H01J 37/3244* (2013.01)

(58) Field of Classification Search
CPC ........... C23C 16/45565; C23C 16/4412; H01J 37/3244
USPC ......... 118/715, 728, 50; 156/345.29, 345.33, 156/345.34, 345.35, 345.36, 345.26, 156/345.51
See application file for complete search history.

(56) References Cited

U.S. PATENT DOCUMENTS

| | | | |
|---|---|---|---|
| 6,066,196 A | 5/2000 | Kaloyeros et al. | |
| 6,136,725 A | 10/2000 | Loan et al. | |
| 6,156,151 A * | 12/2000 | Komino | H01J 37/3244 118/723 R |
| 6,565,661 B1 * | 5/2003 | Nguyen | C23C 16/4557 118/715 |
| 6,663,716 B2 | 12/2003 | Loan et al. | |

(Continued)

FOREIGN PATENT DOCUMENTS

| | | |
|---|---|---|
| WO | 1999053117 A3 | 10/1999 |
| WO | 2008094752 A1 | 8/2008 |

(Continued)

OTHER PUBLICATIONS

PCT International Search Report and Written Opinion in PCT/US2021/055557 dated Feb. 11, 2022, 9 pages.

*Primary Examiner* — Rudy Zervigon
(74) *Attorney, Agent, or Firm* — Servilla Whitney LLC

(57) ABSTRACT

Gas distribution assemblies and methods for providing a flow of gases to a process station are described. The gas distribution assemblies comprise a pumping liner with a showerhead and a gas funnel positioned therein. The pumping liner has an inner wall that slants at a first angle relative to a central axis of the gas distribution assembly so that the inner wall adjacent the bottom wall of the pumping liner is closer to the central axis than the inner wall adjacent the top wall. The gas funnel and pumping liner form a plenum between the outer wall of the gas funnel, a cavity in the bottom wall of the gas funnel and the inner wall of the pumping liner.

18 Claims, 7 Drawing Sheets

(56) References Cited

U.S. PATENT DOCUMENTS

| | | | |
|---|---|---|---|
| 7,712,434 B2 * | 5/2010 | Dhindsa | H01J 37/32724 |
| | | | 156/345.43 |
| 20,110,065 | 3/2011 | Ganguly et al. | |
| 7,918,938 B2 | 4/2011 | Provencher et al. | |
| 8,846,163 B2 | 9/2014 | Kao et al. | |
| 9,508,561 B2 | 11/2016 | Naik et al. | |
| 10,276,353 B2 | 4/2019 | Alayavalli et al. | |
| 10,741,428 B2 | 8/2020 | Hunter et al. | |
| 11,066,747 B2 | 7/2021 | Liang et al. | |
| 2004/0221808 A1 * | 11/2004 | Kawano | F16J 15/0887 |
| | | | 118/715 |
| 2005/0150452 A1 | 7/2005 | Sen et al. | |
| 2009/0084317 A1 | 4/2009 | Wu et al. | |
| 2010/0081292 A1 * | 4/2010 | Narushima | C23C 16/56 |
| | | | 438/785 |
| 2010/0261302 A1 | 10/2010 | Rana et al. | |
| 2010/0279008 A1 * | 11/2010 | Takagi | H01L 21/02197 |
| | | | 118/725 |
| 2012/0090691 A1 | 4/2012 | Baluja et al. | |
| 2013/0210241 A1 | 8/2013 | Lavoie et al. | |
| 2013/0269735 A1 | 10/2013 | Roetzel et al. | |
| 2013/0344688 A1 | 12/2013 | Ye | |
| 2014/0023794 A1 | 1/2014 | Mahajani et al. | |
| 2014/0036274 A1 * | 2/2014 | Marquardt | G01B 11/14 |
| | | | 219/385 |
| 2014/0261176 A1 | 9/2014 | Liu et al. | |
| 2015/0211123 A1 | 7/2015 | Glukhoy | |
| 2016/0145742 A1 | 5/2016 | Janakiraman et al. | |
| 2016/0153088 A1 * | 6/2016 | Tsuji | C23C 16/4408 |
| | | | 118/728 |
| 2017/0051402 A1 * | 2/2017 | Mori | H01L 21/67103 |
| 2019/0048467 A1 | 2/2019 | Sanchez et al. | |
| 2019/0301009 A1 | 10/2019 | Kaufman-Osborn et al. | |
| 2021/0230070 A1 | 7/2021 | Sun et al. | |
| 2021/0367063 A1 | 11/2021 | Kao et al. | |
| 2021/0395892 A1 | 12/2021 | Mustafa et al. | |

FOREIGN PATENT DOCUMENTS

| | | |
|---|---|---|
| WO | 2011112812 A2 | 9/2011 |
| WO | 2011112823 A2 | 9/2011 |
| WO | 2018213621 A2 | 11/2018 |
| WO | 2020243288 A1 | 12/2020 |
| WO | 2021055990 A1 | 3/2021 |
| WO | 2021247590 A1 | 12/2021 |
| WO | 2021257773 A1 | 12/2021 |

* cited by examiner

THERMALLY UNIFORM DEPOSITION STATION

TECHNICAL FIELD

Embodiments of the disclosure generally relate to semiconductor manufacturing apparatus and processes. In particular, embodiments of the disclosure are directed to process stations for use with large bore, no weld lids with built-in metrology.

BACKGROUND

Gas flow paths including various valves are common in the semiconductor manufacturing industry. Current flow path configurations have dead volumes that require a purge to prevent process gas back flow into the clean gas manifold. This is especially important where reactive gases are employed to prevent gas phase reactions and film deposition in the gas lines. The reaction products can damage the manufacturing equipment by chemical reaction, cause clogging or contaminate subsequent film depositions.

Additionally, the residue left from gas phase reactions in the process lines can have a substantial negative effect on subsequent processes. The residue may react with subsequent gases or process conditions creating undesired products. The residue can also enter the process space and form particulates on the substrate, damaging the device being manufactured. The manufacturing equipment needs to be subjected to extensive maintenance to remove and replace clogged lines and valves leading to significant downtime and a loss of throughput.

During semiconductor manufacturing, maintaining thermal uniformity of the substrate during a deposition process is important for controlling the uniformity of the deposition. Additionally, characteristics of the process chamber, for example, reaction volume, flow uniformity and the ability to have rapid cycle times are important. Current process stations often have dead volume which prevent rapid gas exchange increasing cycle times. Additionally, the thermal uniformity of the substrate is inconsistent in many conventional process environments.

Accordingly, there is a need for improved apparatus and methods for vapor deposition processes.

SUMMARY

One or more embodiments of the disclosure are directed to gas distribution assemblies comprising a pumping liner, a showerhead, and a gas funnel. The pumping liner comprises a cylindrical body with an open central region, the pumping liner having an inner wall, an outer wall, a top wall and a bottom wall, the inner wall slanting at a first angle relative to a central axis of the gas distribution assembly so that the inner wall adjacent the bottom wall is closer to the central axis than the inner wall adjacent the top wall. The showerhead has a front surface and a back surface defining a thickness with a plurality of apertures extending through the thickness, the showerhead is positioned so that an outer portion of the back surface is adjacent the bottom wall of the pumping liner. The gas funnel has an upper portion and a lower portion, the lower portion of the gas funnel is positioned within the open central region of the pumping liner, the lower portion comprising a front surface, a back surface and an outer wall, the upper portion comprising an inner wall, an outer wall spaced a greater distance from a central axis of the gas funnel than the outer wall of the lower portion, a top wall and a bottom wall with a cavity in the bottom wall, the cavity having an inner cavity wall and an outer cavity wall, the lower portion of the outer wall having a slant at a second angle relative to the central axis of the gas distribution assembly, the lower portion having an opening extending from the back surface to the front surface, the opening formed around the central axis, the front surface having a contoured surface with an inner peripheral edge spaced an inner distance from the back surface of the showerhead and an outer peripheral edge in direct contact with the back surface of the showerhead forming a funnel gap between the front surface of the gas funnel and the back surface of the showerhead. The gas funnel and pumping liner form a plenum between the outer wall of the lower portion of the gas funnel, the cavity in the bottom wall of the upper portion of the gas funnel and the inner wall of the pumping liner.

Additional embodiments of the disclosure are directed to processing chambers comprising a chamber body, at least one substrate support, a chamber lid and a gas distribution assembly. The chamber body has sidewalls and bottom bounding a process volume, the sidewalls having a top lip. The at least one substrate support is within the process volume and the at least one substrate support has a support surface. The chamber lid is positioned over and in contact with the lip of the sidewalls of the chamber body. The gas distribution assembly comprises a pumping liner, a showerhead, and a gas funnel. The pumping liner comprises a cylindrical body with an open central region, the pumping liner having an inner wall, an outer wall, a top wall and a bottom wall, the inner wall slanting at a first angle relative to a central axis of the gas distribution assembly so that the inner wall adjacent the bottom wall is closer to the central axis than the inner wall adjacent the top wall. The showerhead has a front surface and a back surface defining a thickness with a plurality of apertures extending through the thickness, the showerhead is positioned so that an outer portion of the back surface is adjacent the bottom wall of the pumping liner. The gas funnel has an upper portion and a lower portion, the lower portion of the gas funnel is positioned within the open central region of the pumping liner, the lower portion comprising a front surface, a back surface and an outer wall, the upper portion comprising an inner wall, an outer wall spaced a greater distance from a central axis of the gas funnel than the outer wall of the lower portion, a top wall and a bottom wall with a cavity in the bottom wall, the cavity having an inner cavity wall and an outer cavity wall, the lower portion of the outer wall having a slant at a second angle relative to the central axis of the gas distribution assembly, the lower portion having an opening extending from the back surface to the front surface, the opening formed around the central axis, the front surface having a contoured surface with an inner peripheral edge spaced an inner distance from the back surface of the showerhead and an outer peripheral edge in direct contact with the back surface of the showerhead forming a funnel gap between the front surface of the gas funnel and the back surface of the showerhead. The gas funnel and pumping liner form a plenum between the outer wall of the lower portion of the gas funnel, the cavity in the bottom wall of the upper portion of the gas funnel and the inner wall of the pumping liner.

Further embodiments of the disclosure are directed to processing methods comprising flowing a first gas through a first inlet line into a gas funnel of a gas distribution assembly, igniting a plasma of the first gas inlet, exhausting gases through a pumping liner of the gas distribution assembly and powering a liner heater to control a temperature in the pumping liner. The gas distribution assembly comprises a pumping liner, a showerhead, and a gas funnel. The pumping liner comprises a cylindrical body with an open central region, the pumping liner having an inner wall, an outer wall, a top wall and a bottom wall, the inner wall slanting at a first angle relative to a central axis of the gas distribution assembly so that the inner wall adjacent the bottom wall is closer to the central axis than the inner wall adjacent the top wall. The showerhead has a front surface and a back surface defining a thickness with a plurality of apertures extending through the thickness, the showerhead is positioned so that an outer portion of the back surface is adjacent the bottom wall of the pumping liner. The gas funnel has an upper portion and a lower portion, the lower portion of the gas funnel is positioned within the open central region of the pumping liner, the lower portion comprising a front surface, a back surface and an outer wall, the upper portion comprising an inner wall, an outer wall spaced a greater distance from a central axis of the gas funnel than the outer wall of the lower portion, a top wall and a bottom wall with a cavity in the bottom wall, the cavity having an inner cavity wall and an outer cavity wall, the lower portion of the outer wall having a slant at a second angle relative to the central axis of the gas distribution assembly, the lower portion having an opening extending from the back surface to the front surface, the opening formed around the central axis, the front surface having a contoured surface with an inner peripheral edge spaced an inner distance from the back surface of the showerhead and an outer peripheral edge in direct contact with the back surface of the showerhead forming a funnel gap between the front surface of the gas funnel and the back surface of the showerhead. The gas funnel and pumping liner form a plenum between the outer wall of the lower portion of the gas funnel, the cavity in the bottom wall of the upper portion of the gas funnel and the inner wall of the pumping liner. A liner heater is positioned adjacent the back surface of the lower portion of the gas funnel.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
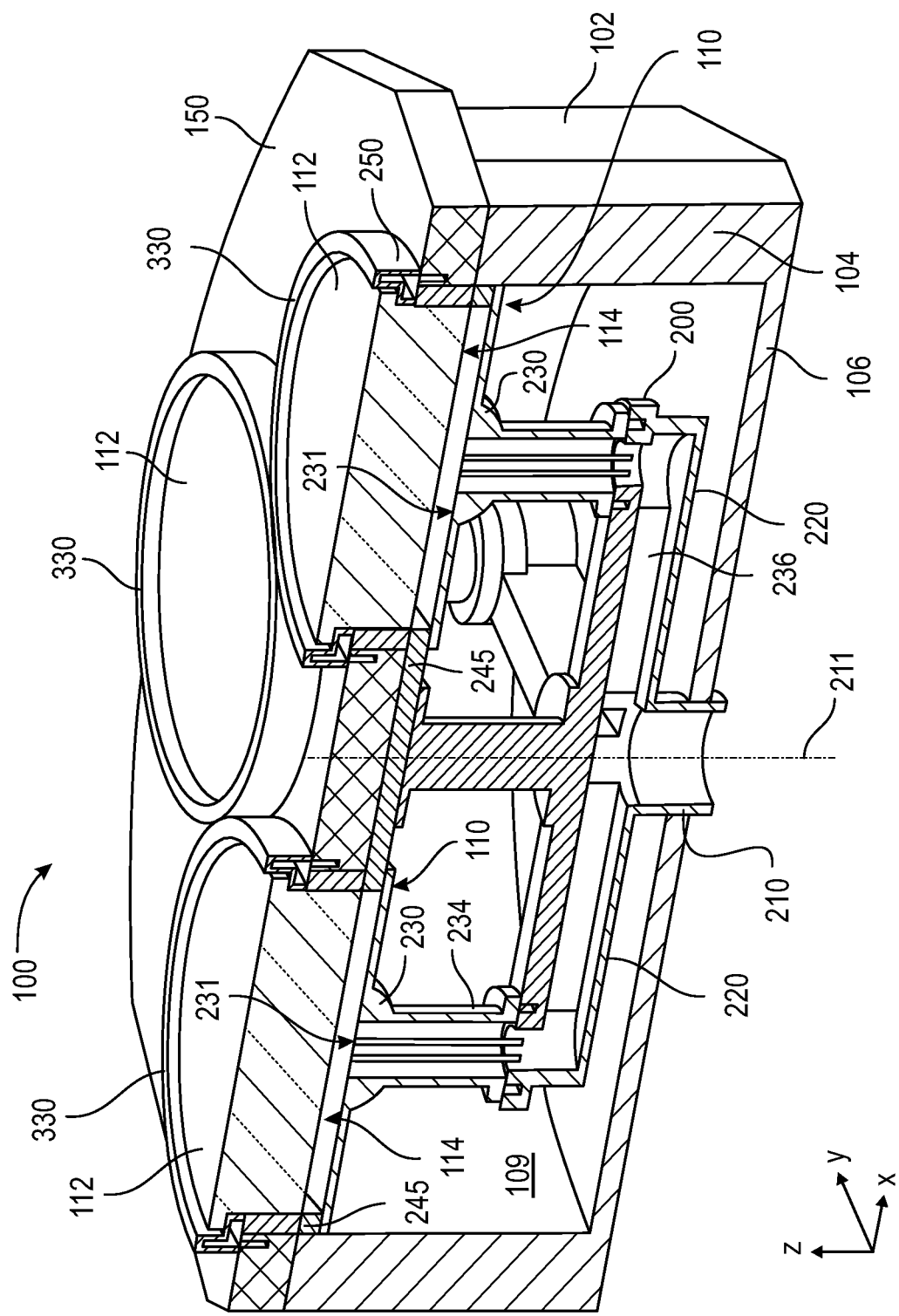
FIG. 1 shows a cross-sectional isometric view of a processing chamber in accordance with one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface, or with a film formed on the substrate surface.

One or more embodiments of the disclosure provide thermal deposition stations for any deposition process. In some embodiments, the thermal deposition stations are configured for atomic layer deposition (ALD) process. Some embodiments of the disclosure provide thermal deposition stations having a low overall volume. Sone embodiments provide thermal deposition stations with no dead zones. Some embodiments provide thermal deposition stations with controlled gaps with thermal isolation ability for specific components and optimized thermal uniformity.

Some embodiments of the disclosure are directed to process stations or gas injectors that combine low flow volume, good thermal uniformity, and good flow uniformity. The low flow volume enables fast cycle time. Thermal uniformity in some embodiments is achieved through managing contact between components. In some embodiments, flow uniformity is achieved through optimization of the showerhead hole pattern. Some embodiments of the disclosure provide gas injectors with reduced volume, fast gas exchange, improved thermal uniformity and reduced costs.

One or more embodiments provide an assembly comprising a showerhead base (also referred to as a gas funnel), pumping ring, showerhead, heater assembly, and ancillary components. In some embodiments, components are detachable to avoid costs associated with joining methods, such as welding or brazing. In some embodiments, the showerhead base and pumping liner are bolted together to form an outer exhaust channel.

In some embodiments, the showerhead contains both the gas injection holes and the exhaust holes. This allows for different hardware configurations for a given process by allowing for single-part substitutions. The exhaust holes are angled to allow pumping closer to the edge of the wafer. In some embodiments, rapid gas exchange is enabled by plenum formed with minimal volume and an improved showerhead conductance for balancing transient response versus steady-state uniformity.

One or more embodiments of the disclosure are directed to deposition chamber lids and gas distribution assemblies with improved thermal uniformity. In one or more embodiments, the gas funnel is bolted to the showerhead. Without being bound by any particular theory of operation, it is believed that direct surface to surface (e.g., metal to metal) contact between the gas funnel and showerhead provides for good thermal contact. As such, heat transfer between a thermal element positioned over the gas funnel and the showerhead is improved. In one or more embodiments, thermal uniformity is further improved by direct surface to surface contact between the pumping liner and the lid.

In one or more embodiments, the gas injector is positioned in an opening in the process chamber lid. In some embodiments, the process chamber lid is thermally non-uniform, and to avoid thermal loss between surface to surface contact of the lid and pumping liner of the gas injector, at least one pad is placed between the pumping liner and lid to minimize thermal loss. In some embodiments, there are three pads positioned between the pumping ring and the lid to minimize thermal losses to the lower temperature lid plate.

In some embodiments, the showerhead is thermally isolated from the pumping liner through a controlled gap. The pumping liner is connected to and in contact with the lid, and the showerhead is bolted to the gas funnel. In some embodiments, the showerhead is further thermally isolated from the lid through a controlled gap.

In some embodiments, the showerhead is isolated from all three of the pumping liner, gas funnel and chamber lid through controlled gaps as explained in further detail below to minimize thermal loss from the showerhead and to maintain consistent thermal uniformity. Thermal uniformity is controlled by controlling the contact between the aforementioned components. The heater ring and purge ring are bolted to the top of the gas funnel to provide heating to the assembly. The gas funnel is bolted to the showerhead for improved thermal conductivity from the heater ring to the showerhead through the gas funnel. The showerhead is thermally isolated from the pumping liner through a controlled gap to reduced heat transfer to a thermally non-uniform component. Similarly, the pumping liner has minimum contact to the chamber lid, which is also thermally non-uniform. Controlling the contacts allows the showerhead to maintain a uniform temperature profile. This design and configuration allow for the bottom surface of the showerhead which faces the substrate within the processing station to have a concentric thermal profile, even when the plate it is mounted on has a larger temperature non-uniformity. This enables wafer temperature uniformity comparable to a single-wafer platform.

In some embodiments, the gas funnel and pumping liner form a plenum between the outer wall of the lower portion of the gas funnel, the cavity in the bottom wall of the upper portion of the gas funnel and the inner wall of the pumping liner. The plenum is configured for removing exhaust gases.

Figure 2:
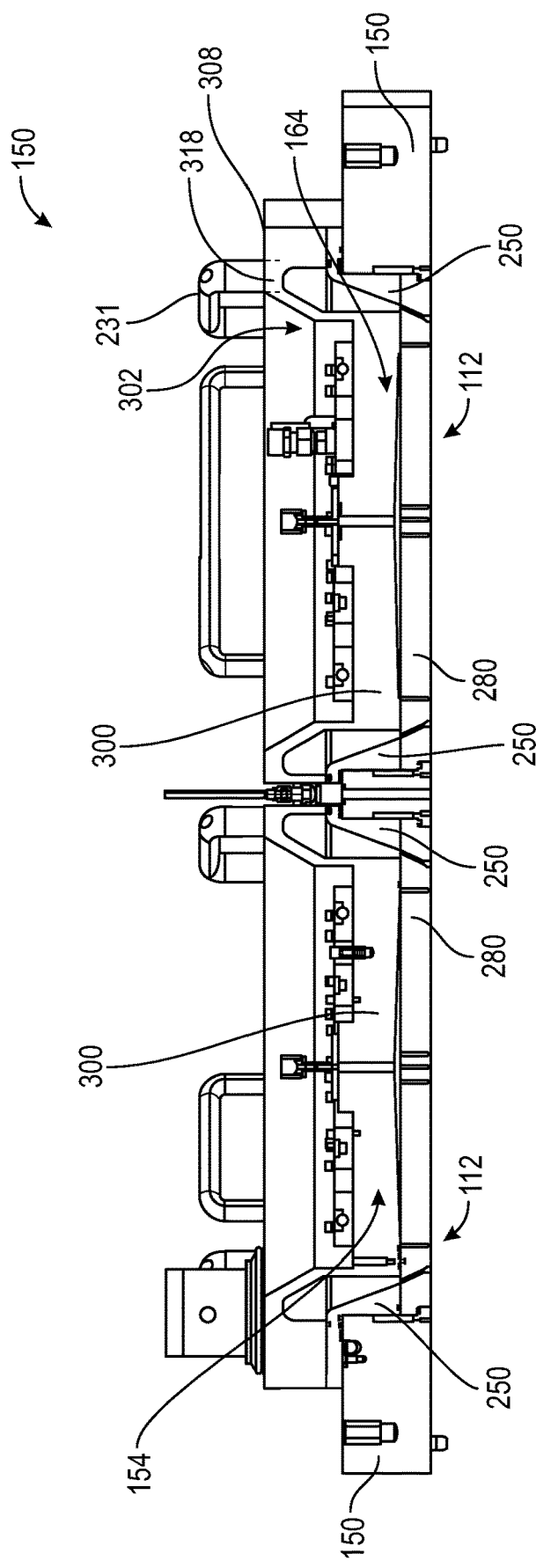
FIG. 2 shows a cross-sectional view of a processing chamber in accordance with one or more embodiment of the disclosure.
Figure 3:
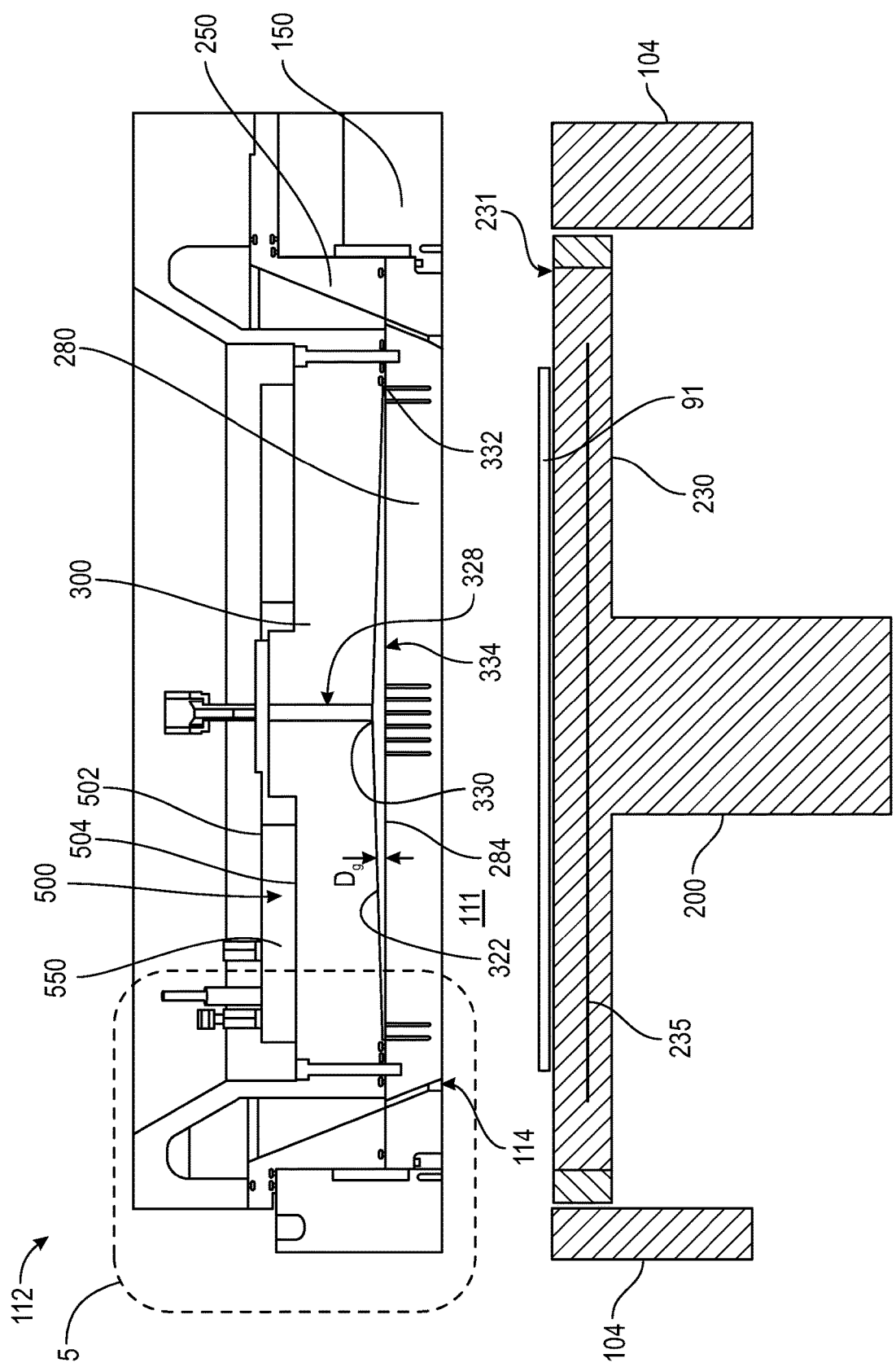
FIG. 3 shows a cross-sectional view of a process chamber lid in accordance with one or more embodiment of the disclosure.
Figure 4:
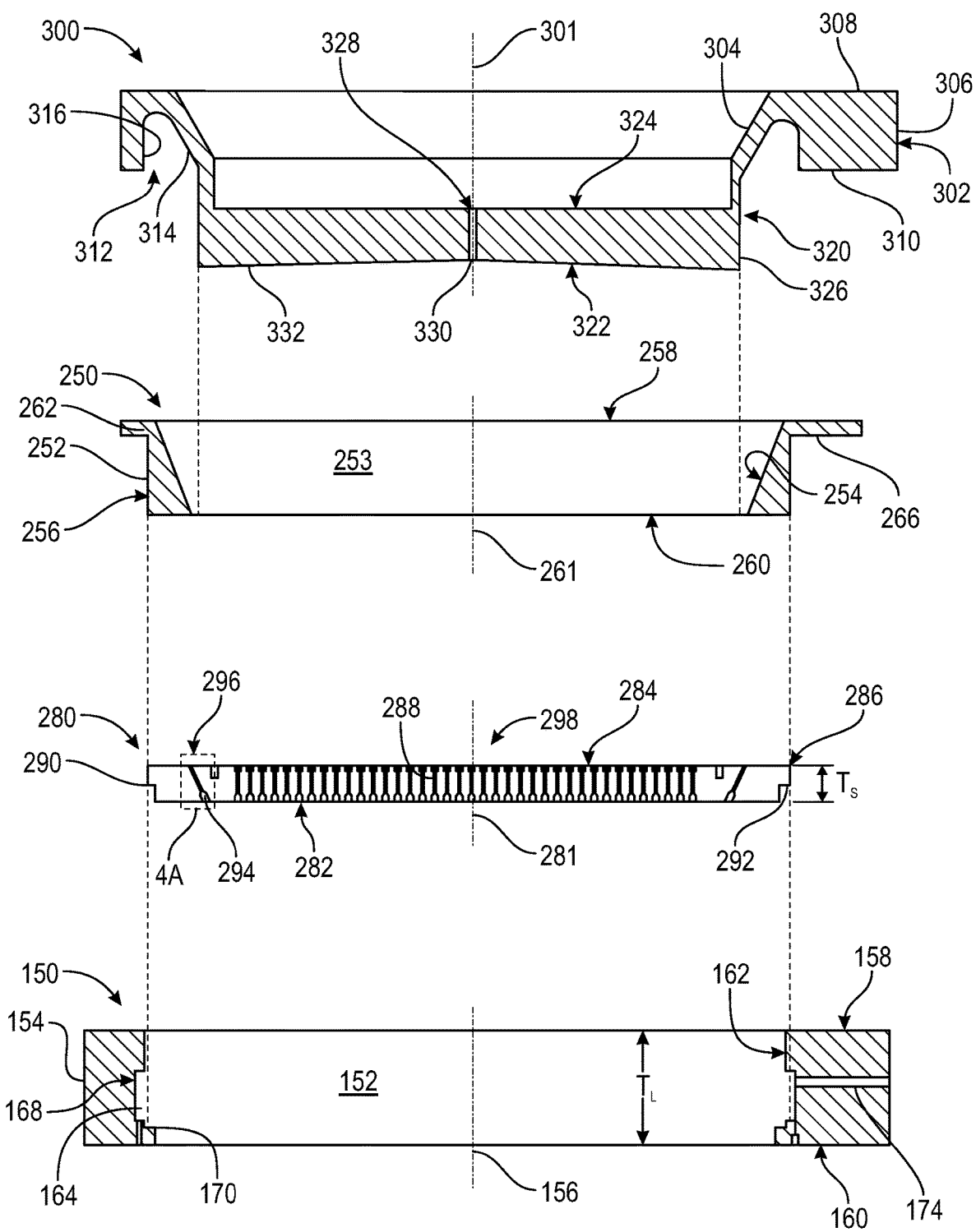
FIG. 4 shows a cross-sectional side view of a gas distribution assembly in accordance with one or more embodiment of the disclosure.
Figure 5:
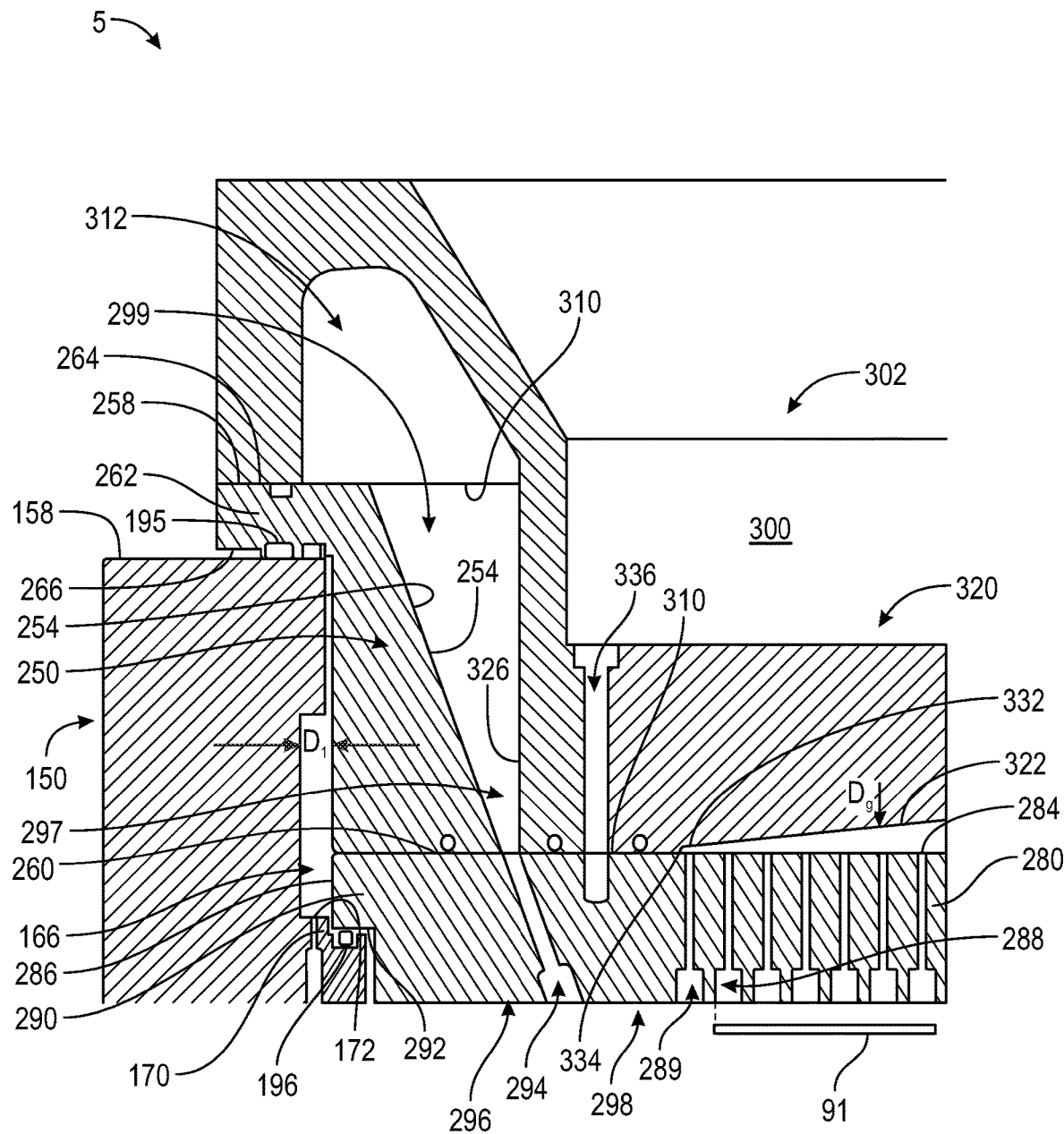
FIG. 5 is an exploded partial cross-sectional view of a region 5 of FIG. 3.

Accordingly, one or more embodiments of the disclosure are directed to process chamber lid 150 configured for high temperature gas delivery. FIG. 1 illustrates an isometric view of a process chamber 100 according to one or more embodiment of the disclosure. FIG. 2 illustrates a cross-sectional view of an exemplary process chamber lid 150. FIG. 3 illustrates the chamber lid 150 separated from a substrate support assembly 200. FIG. 4 illustrates an exploded view of the chamber lid 150. FIG. 5 illustrates a detailed view of the chamber lid 150. The various shading shown in the figures is for descriptive purposes only to aid in identification of parts and does not imply any particular material of construction.

With reference to FIGS. 1 through 3, the process chamber lid 150 includes a gas distribution assembly 112 comprising a pumping liner 250, a gas funnel 300 and a showerhead 280 as described herein. In some embodiments, the process chamber lid 150 comprises openings 152 through which gas distribution assemblies 112 are positioned within.

The processing chamber 100 of some embodiments has a housing 102 with walls 104 and a bottom 106. The housing 102 along with the chamber lid 150 define an interior volume 109. The processing chamber 100 incorporates a substrate support assembly 200. As used in this manner, an "assembly" refers to a combination of components or parts. A substrate support assembly 200 according to one or more embodiments comprises at least a support shaft 234 and a substrate support 230, as described further below.

The processing chamber 100 illustrated includes a plurality of processing stations 110. The processing stations 110 are located in the interior volume 109 of the housing 102 and are positioned in a circular arrangement around the rotational axis 211 of the substrate support assembly 200. Each processing station 110 comprises a gas distribution assembly 112 (also referred to as a gas injector) having a front surface 114. The processing stations 110 are defined as a region in which processing can occur. For example, in some embodiments, a processing station 110 is defined as a region, or process volume 111, bounded by the support surface 231 of the substrate support 230, as described below, and the front surface 114 of the gas distribution assembly 112. The distribution assembly 112, as discussed further below, is a part of the gas distribution assembly 105.

The processing stations 110 can be configured to perform any suitable process and provide any suitable process conditions. The type of gas distribution assembly 112 used will depend on, for example, the type of process being performed and/or the type of showerhead or gas distribution plate. For example, a processing station 110 configured to operate as an atomic layer deposition apparatus may have a showerhead or vortex type gas injector. Whereas, a processing station 110 configured to operate as a plasma station may have one or more electrode and/or grounded plate configuration to generate a plasma while allowing a plasma gas to flow toward the substrate. Suitable processing stations 110 include, but are not limited to, thermal processing stations (e.g., chemical vapor deposition (CVD), atomic layer deposition (ALD)), microwave plasma, three-electrode CCP, ICP, parallel plate CCP, physical vapor deposition (PVD), UV exposure, laser processing, pumping chambers, annealing stations and metrology stations.

In some embodiments, the support assembly 200 includes a rotatable center base 210. The rotatable center base 210 defines a rotational axis 211 that extends along a first direction. As a coordinate system, the rotational axis 211 extends along the Z direction so that rotation around the rotational axis 211 occurs in the X-Y plane. The first direction may be referred to as the vertical direction or along the Z-axis; however, it will be understood that use of the term "vertical" in this manner is not limited to a direction normal to the pull of gravity. As used herein, when the center base 210 is "rotated" around the rotational axis 211, the center base 210 is spinning in the X-Y plane. As used herein, movement "along" the rotational axis 211 or the first direction means that the center base 210, or stated component, is moving in the Z-axis.

The support assembly 200 includes at least two support arms 220 connected to and extending from the center base 210. Each of the support arms 220 has a top surface and the bottom surface that define a thickness of the support arm 220. The support arms 220 have an inner end and an outer end. The inner end is in contact with the center base 210 so that when the center base 210 rotates around the rotational axis 211, the support arms 220 rotate as well. The support arms 220 of some embodiments are connected to the center base 210 at the inner end by fasteners (e.g., bolts). In some embodiments, the support arms 220 are integrally formed with the center base 210.

In some embodiments, the support arms 220 extend orthogonal to the rotational axis 211 so that one of the inner ends or outer ends are further from the rotational axis 211 than the other of the inner ends and outer ends on the same support arm 220. In some embodiments, the inner end of the support arm is closer to the rotational axis 211 than the outer end of the same support arm 220.

The number of support arms 220 in the support assembly 200 can vary. In some embodiments, there are at least two support arms 220, at least three support arms 220, at least four support arms 220, or at least five support arms 220. In some embodiments, there are three support arms 220. In some embodiments, there are four support arms 220. In some embodiments, there are five support arms 220. In some embodiments, there are six support arms 220.

The support arms 220 can be arranged symmetrically around the center base 210. For example, in a support assembly 200 with four support arms 220, each of the support arms 220 are positioned at 90° intervals around the center base 210. In a support assembly 200 with three support arms 220, the support arms 220 are positioned at 120° intervals around the center base 210. Stated differently, in embodiments with four support arms 220, the support arms are arrange to provide four-fold symmetry around the rotational axis 211. In some embodiments, the support assembly 200 has n-number of support arms 220 and the n-number of support arms 220 are arranged to provide n-fold symmetry around the rotation axis 211. In some embodiments, there is the same number of support arms 220 as process stations 110.

In some embodiments, a support shaft 234 is located at the outer end of each of the support arms 220. The support shaft 234 acts as a standoff to space the substrate support 230 a distance from the top surface of the support arms 220 along the first direction.

A substrate support 230 is positioned at the outer ends of the support arms 220. In some embodiments, the substrate support 230 is positioned on the support shaft 234 at the outer ends of the support arms 220. The center of the substrate supports 230 are located at a distance from the rotational axis 211 so that upon rotation of the center base 210 the substrate supports 230 move in a circular path offset from the rotational axis.

The substrate supports 230 have a support surface 231 configured to support a substrate during processing. In some embodiments, the support surfaces 231 of all of the substrate supports 230 are substantially coplanar. As used in this manner, "substantially coplanar" means that the planes formed by the individual support surfaces 231 are within ±5°, ±4°, ±3°, ±2° or ±1° of the planes formed by the other support surfaces 231.

The substrate supports 230 of some embodiments are heaters. The heaters can be any suitable type of heater known to the skilled artisan. In some embodiments, the heater is a resistive heater with one or more heating elements 235 within a heater body. For example, the embodiment illustrated in FIG. 3 has the substrate support 230 as a heater so that the heater body has a heating element 235 therein. In some embodiments, the substrate supports 230 comprise an electrostatic chuck. In some embodiments, the substrate support 230 comprises a heater and an electrostatic chuck. This allows a wafer to be chucked onto a heater at the beginning of a process and remain in that same position on that same heater while moving to different process stations.

FIGS. 3 to 5 illustrate a segment of the chamber lid 150 having an opening 152 through which gas distribution assembly 112 are positioned within. The present disclosure advantageously provides for thermal isolation between the chamber lid 150 and components of the gas distribution assembly 112. Thermally isolating at least the pumping liner 250 and the showerhead 280 from the chamber lid 150 reduces or minimizes heat transfer from the pumping liner 250 and the showerhead 280 to the chamber lid 150, ensuring good thermal uniformity of the showerhead 280.

The pumping liner 250 has a body 252 with any suitable shape. In some embodiments, as shown in the figures, the body 252 has a generally cylindrical body. However, the skilled artisan will recognize that the pumping liner 250 can have any suitable shape depending on, for example, the process chamber lid in which the liner will be used.

The body 252 of the pumping liner 250 has an open central region 253, an inner wall 254 and an outer wall 256. The inner wall 254 and outer wall 256 are spaced a distance from a central axis 261 of the body 252 of the pumping liner. The outer wall 256 is positioned a greater distance from the central axis 261 than the inner wall 254 is from the central axis 261. The inner wall 254 has an inner face that extends around the central axis 261 of the body 252. The body 252 further comprises a top wall 258 and a bottom wall 260. The open central region 253 extends through the top wall 258 and bottom wall 260 and is defined or bounded by the inner wall 254. In some embodiments, the inner wall 254 is slanted at a first angle relative to the central axis 261 of pumping liner 250 so that the inner wall 254 adjacent the bottom wall 260 is closer to the central axis 261 than the inner wall 254 adjacent the top wall 258.

The segments of the chamber lid 150 depicted in FIGS. 3 to 5 comprises a body 154 having an opening 152 defining an open central region. The body 154 has a top wall 158, a bottom wall 160 and an inner sidewall 162 positioned a distance from a central axis 156 of the opening 152. The top wall 158 and bottom wall 160 define a thickness $T_L$, the opening 152 extending through the entire thickness $T_L$.

In some embodiments, an outer peripheral edge 286 of the showerhead 280 is thermally isolated from the chamber lid 150 by a gap 166. The surface contact between the chamber lid 150 and the outer peripheral edge 286 of the showerhead 280 is minimized to reduce heat transfer and ensure thermal uniformity of the showerhead 280. In some embodiments, a thermally isolating pad 195 is positioned between the contact points of the chamber lid 150 and the outer peripheral edge 286 of the showerhead 280. The thermally isolating pad 195 has a low thermal conductivity.

The inner sidewall 162 has a circular channel 164 having a channel wall 168. The channel wall 168 is positioned a greater distance from the central axis 156 than the inner sidewall 162. As described in further detail below, and as best shown in FIG. 5, an outer peripheral edge 286 of the showerhead 280 is positioned within the gap 166 and spaced a distance $D_1$ from the channel wall 168 to minimize or reduce heat transfer between the showerhead 280 and the chamber lid 150.

As described in further detail below and as best shown in FIG. 5, a ledge 170 is positioned adjacent to a channel wall 172 of the circular channel 164. The outer peripheral edge 286 of the showerhead 280 contacts the ledge 170.

Referring back to FIGS. 3 to 5, the gap 166 of the circular channel 164 is configured as a gas plenum of a pump/purge spacer. An inlet 174 extends through the channel wall 168 to fluidly connect the gap 166 to a vacuum pump or other vacuum source to direct gas escaping the process volume 111 through gap 166 and out the inlet 174 to create a gas curtain type barrier to prevent leakage of process gases from the interior of the processing chamber.

A showerhead 280 is positioned under and in contact with the bottom wall 260 of the pumping liner 250. The showerhead 280 has a front surface 282 and a back surface 284 defining a thickness $T_S$ of the showerhead 280, an inner portion 298 and an outer portion 296 having an outer peripheral edge 286.

The inner portion 298 comprises a plurality of apertures 288 extending through the thickness of the showerhead 280. The plurality of apertures 288 have openings in the front surface 282 and the back surface 284. The showerhead 280 can be any suitable showerhead known to the skilled artisan with any suitable number of apertures 288 arranged in any suitable configuration. The number, size and spacing of the plurality of apertures 288 can be varied. In some embodiments, there are greater than or equal to about 48 plurality of apertures 288 equally spaced around the inner portion 298 of the showerhead 280.

The outer portion 296 of the back surface 284 of the showerhead 280 is adjacent to the bottom wall 260 of the pumping liner 250. In some embodiments, the outer portion 296 is in direct contact with the bottom wall 260 of the pumping liner 250. In some embodiments, a thermally isolating pad (not shown) is in-between the outer portion 296 of the back surface 284 of the showerhead 280 and the bottom wall 260 of the pumping liner 250.

In some embodiments, the back surface 284 of the showerhead 280 is thermally isolated from the bottom wall 260 of the pumping liner 250 to reduce or minimize heat transfer between the showerhead 280 and the pumping liner 250. Reducing or minimizing heat transfer between the showerhead 280 and the pumping liner 250 increases heat uniformity on the front surface 282 of the showerhead 280. In some embodiments, the showerhead 280 and the pumping liner 250 are separated by a controlled gap. In some embodiments, one or more isolating thermal pads are positioned between the back surface 284 of the showerhead 280 and the bottom wall 260 of the pumping liner 250. The gap or one or more isolating thermal pads are positioned at the outer portion 296 of the showerhead 280.

In some embodiments, the outer portion 296 of the showerhead 280 is in direct contact with the bottom wall 260 of the pumping liner 250. In such a configuration, the pumping liner 250 is thermally isolated from the chamber lid 150. As used herein, the term "direct contact" means that there are no intervening components other than O-rings separating the recited parts.

In some embodiments the front surface 282 of the showerhead 280 comprises at least one exhaust port 294 positioned within the outer portion 296 of the showerhead 280. The exhaust port 294 provides fluid communication with the back surface 284 of the showerhead. In the embodiment illustrated in the figures, the showerhead 280 comprises two exhaust ports 294. The skilled artisan will recognize that there can be any suitable number of exhaust ports 294.

In some embodiments, the showerhead 280 comprises two exhaust ports 294 positioned about 180° apart relative to the central axis 281 of the showerhead 280. Being spaced apart relative to the central axis means that the stated components are at different rotational positions based on the central axis, the distance from the central axis can be the same or different. In some embodiments, there are three exhaust ports 294 positioned about 120° apart relative to the central axis 281. In some embodiments, there are four exhaust ports 294 positioned about 90° apart relative to the central axis 281 of the showerhead 280. In some embodiments, as shown in the Figures, the exhaust ports 294 are slanted at the first angle relative to the central axis 281 of pumping liner 250 so that the exhaust ports 294 adjacent the front surface 282 is closer to the central axis 281 of the showerhead 280 than the exhaust ports 294 adjacent to the back surface 284.

Figure 4A:
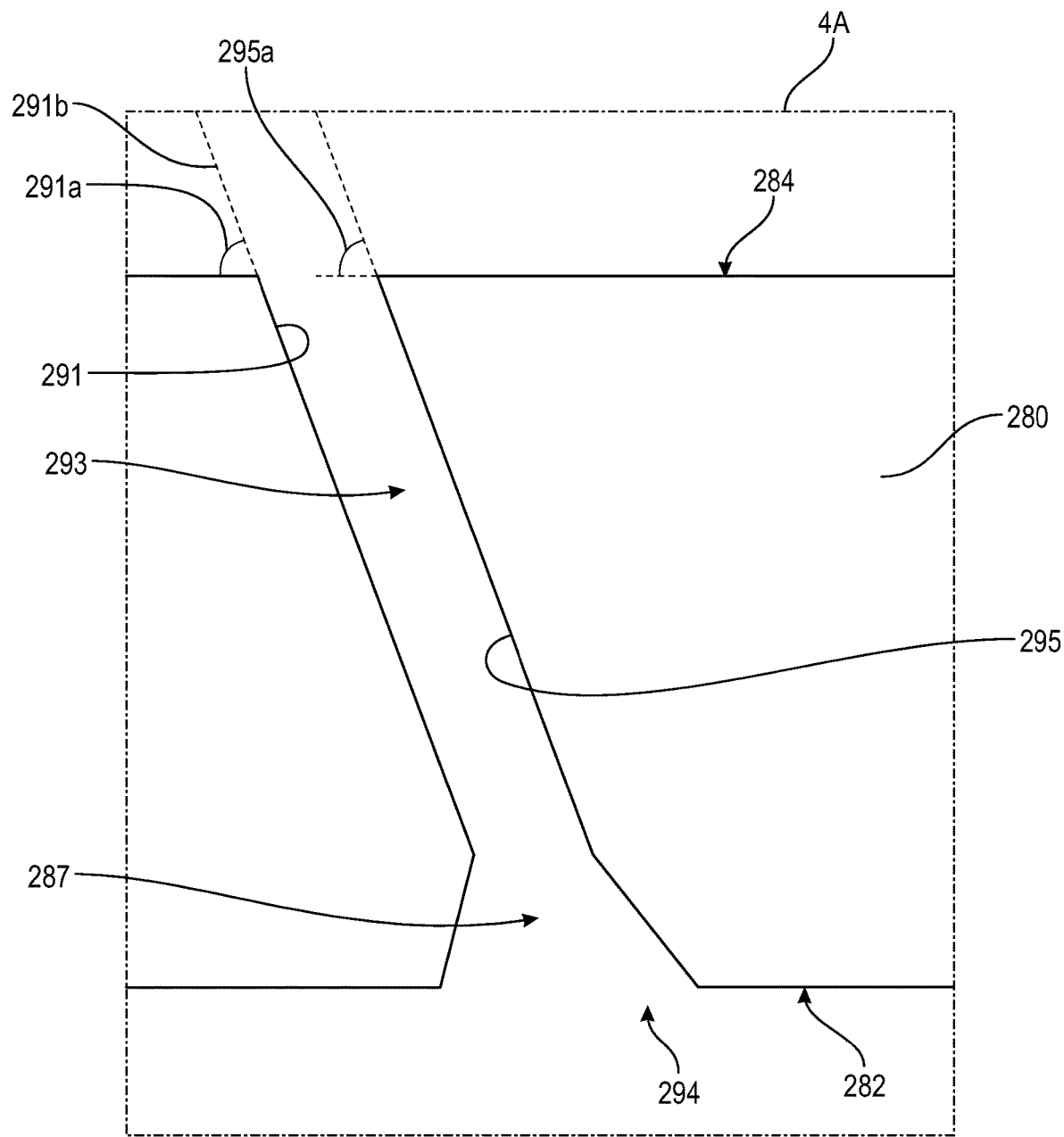
FIG. 4A shows an expanded view of region 4A of FIG. 4.

FIG. 4A shows an expanded view of region 4A of FIG. 4. In FIG. 4A, the at least one exhaust port 294 comprises an aperture 293 extending from the back surface 284 of the showerhead 280 to a circular channel 287 formed in the front surface 282 of the showerhead 280. In some embodiments, the circular channel 287 is formed as a recess in the front surface 284 of the showerhead 280 and extends around the outer portion 296 of the showerhead 280. In some embodiments, the channel 287 flares outwardly from the bottom of the aperture 293 towards the front surface 282 in an inverted funnel or frustoconical shape.

The apertures 293 of some embodiments are slanted at an angle relative to the central axis 281 of the showerhead. The shape of the apertures 293 can be varied. In some embodiments, the apertures 293 are cylindrical in shape and canted at an angle from the back surface 284 to the channel 287 so that the opening in the back surface 284 is further from the central axis 281 than the opening of the aperture 293 at the channel 287.

The apertures 293 have an inner exhaust wall 295 and an outer exhaust wall 291. The skilled artisan will recognize that a cylindrical shaped aperture has a single wall that extends around an axis of the aperture and that the use of the terms inner exhaust wall and outer exhaust wall refer to the innermost portion of the cylindrical cross-section and the outermost portion of the cylindrical cross-section, respectively, of the apertures. In some embodiments, the outer exhaust wall 295 is positioned a greater distance from the central axis 281 of the showerhead 280 (as shown in FIG. 4) relative to the inner exhaust wall 291 from the central axis 281.

The inner exhaust wall 295 has an inner wall angle 295a relative to the back surface 284 of the showerhead 280 and the outer exhaust wall 291 has an outer wall angle 291a relative to the back surface 284 of the showerhead 280. In some embodiments, the inner wall angle 295a and the outer wall angle 291a are substantially the same. As used in this manner, the term "substantially the same" means that the angles are within ±5°, ±4°, ±3°, ±2° or ±1°. In some embodiments, the angle 295a of the inner exhaust wall 295 is greater than the angle 291a of the outer exhaust wall 291. In some embodiments, the angle 295a of the inner exhaust wall 295 is less than the angle 291a of the outer exhaust wall 291. In some embodiments, the aperture 293 has a circular cross-section when viewed along a plane normal the central axis of the aperture. In some embodiments, the aperture 293 has an oval cross-section when viewed along a plane normal to the central axis of the aperture.

Referring to FIGS. 4A and 5, in some embodiments, the outer exhaust wall 291 is aligned with the inner wall 254 of the pumping liner 250. In some embodiments, the outer exhaust wall 291 is offset by ±3°±2° or ±1° relative to the inner wall 254 of the pumping liner 250. In some embodiments, an axis 291b formed by the outer exhaust wall 291 is substantially coaxial with an axis formed by the inner wall 254 of the pumping liner 250, as illustrated in FIG. 5. In some embodiments, the axis 291b formed by the outer exhaust wall 291 of the apertures 293 is at substantially the same angle 291a as the inner wall 254 of the pumping liner 250. In some embodiments, the axis 291b formed by the outer exhaust wall 291 is within ±3 mm, ±2 mm or ±1 mm.

In some embodiments, the outer peripheral edge 286 of the showerhead 280 has a lip 290 having a bottom surface 292 configured to seat the showerhead 280 within a ledge 170 of the chamber lid 150 as discussed in further detail below.

A gas funnel 300 is positioned in the open central region 253 of the pumping liner 250. The gas funnel has a generally cylindrical body. However, the skilled artisan will recognize that the gas funnel 300 can have any suitable shape depending on, for example, the process chamber lid in which the liner will be used. The gas funnel has an upper portion 302 and a lower portion 320, the lower portion 320 being positioned within the open center region 253 of the pumping liner.

The upper portion 302 comprising an inner wall 304, an outer wall 306 spaced a greater distance from a central axis 301 of the gas funnel 300 than the outer wall 306 of the lower portion 302, a top wall 308, and a bottom wall 310. The bottom wall 310 has a cavity 312 configured as a circular channel. The cavity 312 has an inner cavity wall 314 and an outer cavity wall 316. In some embodiments, the inner cavity wall 314 is slanted at a first angle relative to the central axis 301 of the gas funnel 300 so that the inner cavity wall 314 adjacent the bottom wall 310 is closest the central axis 301.

As shown in FIG. 3, in some embodiments, there is an opening 318 in the top wall 308 of the upper portion 302 of the gas funnel 300 in fluid communication with the cavity 312. The opening 318 is in fluid communication with an exhaust manifold 321. The present disclosure advantageously provides for a single exhaust manifold 321 per distribution assembly 112 thus enabling placement of ancillary metrology components (not shown) on the chamber lid 150.

The lower portion 320 of the gas funnel 300 comprises front surface 322, a back surface 324 and an outer wall 326. The lower portion 320 further comprises a gas inlet 328 extending from the back surface 324 to the front surface 322 and formed around the central axis 301 of the gas funnel 300. The gas inlet 328 of the lower portion 320 is in fluid communication with a gas inlet line and the gas inlet 328.

In some embodiments, the gas inlet 328 is symmetrical around a central axis of the gas funnel 300. In some embodiments, the gas inlet 328 is adjacent the front surface 322 flares from a first diameter at the back surface 324 to a second diameter larger than the first diameter at the front surface 322. The diameter of the gas inlet 328 of some embodiments remains substantially uniform (within ±0.1 mm) from the back surface 3324 to a depth within the gas funnel 300 and then flares from the depth within the gas funnel 300 to the second diameter at the front surface 322.

Figure 6:
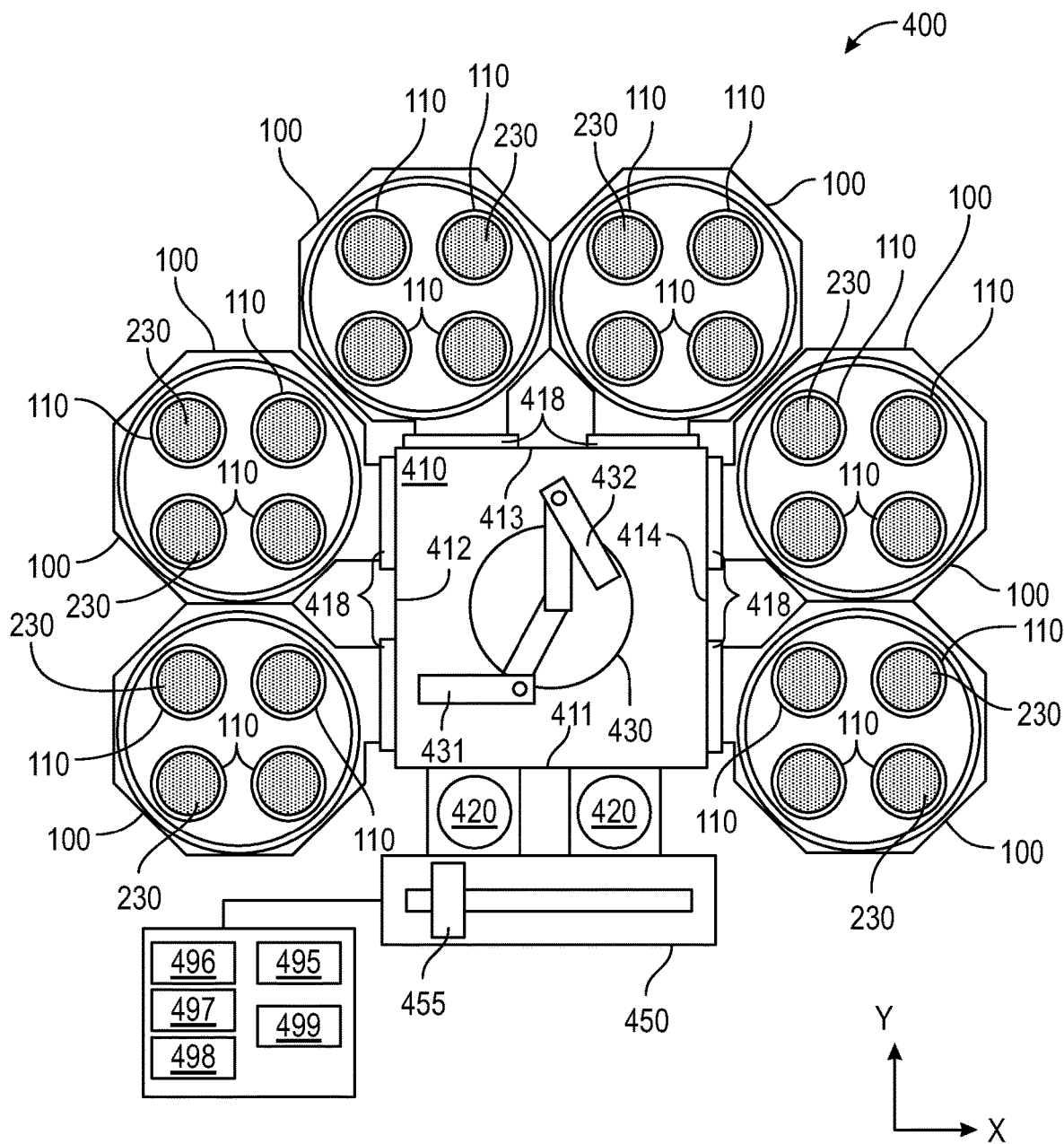
FIG. 6 is a schematic representation of a processing platform in accordance with one or more embodiment of the disclosure.

As shown in FIG. 4, the front surface 322 of the gas funnel 300 has a contoured surface shape with an inner peripheral edge 330 spaced an inner distance $D_g$ from the back surface 284 of the showerhead 280. As best shown in FIG. 6, the front surface 322 further comprises an outer peripheral edge 332 in direct contact with the back surface 284 of the showerhead 280 forming a funnel gap 334 between the front surface 322 of the gas funnel and the back surface of the showerhead.

In some embodiments, the funnel gap 334 has a uniform dimension from edge to edge of the gas funnel 300. In some embodiments, the front surface 322 of the gas funnel 300 has an inverted funnel-like shape with a larger gap adjacent the central axis 301 of the funnel 300 than adjacent the front edge near the outer peripheral region.

In the embodiment illustrated in FIG. 5, the bottom wall 310 of the gas funnel 300 is in direct contact with the back surface 284 of the showerhead 280. In some embodiments, a fastener is positioned within at least one aperture 336 extending through the lower portion 320 for directly securing the gas funnel 300 to the showerhead 280.

As shown, the plurality of apertures 288 of the inner portion 298 of the showerhead 280 covers the substrate 91. An outer most aperture 289 of the plurality of apertures 288 is positioned beyond the substrate 91. In some embodiments, the outer portion 296 of the showerhead 280 comprises the exhaust port 294. The exhaust port 294 is in fluid communication with the plenum 299 and provides fluid communication with the back surface 284 of the showerhead 280.

When assembled, as shown in FIG. 5, a plenum 299 is formed between the outer wall 326 of the lower portion 320 of the gas funnel 300, the cavity 312 in the bottom wall 310 of the upper portion 302 of the gas funnel 300 and the inner wall 254 of the pumping liner 250. A plenum opening 297 is formed between the inner wall 254 of the pumping liner 250 at the bottom wall 260 and the outer wall 326 of the lower portion 320 of the gas funnel 300 at the bottom wall 310 of the upper portion 302 of the gas funnel 300. As shown, the inner wall 254 of the pumping liner 250 at the bottom wall 260 is not in contact with the outer wall 326 of the lower portion 320 of the gas funnel 300 at the bottom wall 310 of the upper portion 302 of the gas funnel 300.

In some embodiments, there is no dead volume in the plenum 299. In some embodiments, there is no recirculation in the plenum 299. Dead volume is space which a gas can form eddies and become stuck so that after flow is stopped some of that gaseous species remains and can be added to the next gas flow.

In some embodiments, a flange 262 extends from the top wall 258 of the pumping liner 250. The flange 262 has a top wall 264 and a bottom wall 266. The bottom wall 266 positioned adjacent to and in contact with a top wall 158 of a chamber lid 150. The top wall 264 of the flange 262 is in contact with the bottom wall 310 of the upper portion 302 of the gas funnel 300.

In some embodiments, the bottom wall 266 of the flange 262 is thermally isolated from the chamber lid 150. In some embodiments, the bottom wall 266 of the flange 262 is thermally isolated from the chamber lid 150 by one or more thermally isolating pads 195.

In some embodiments, the outer peripheral edge 286 of the showerhead 280 is positioned within the gap 166 between the showerhead 280 and chamber lid 150, and is spaced a distance $D_1$ from the channel wall 168 to minimize or reduce heat transfer between the showerhead 280 and the chamber lid 150. In some embodiments, the outer peripheral edge 286 of the showerhead 280 is in contact with the ledge 170 of the chamber lid 150. In some embodiments, a thermally isolating pad 196 is between the ledge 170 and the front surface 282 of the showerhead 280 to reduce or minimize heat transfer between the showerhead 280 and the chamber lid 150. In some embodiments, In some embodiments, the thermally isolating pad 196 is between the ledge 170 of the chamber lid 150 and the bottom surface 292 of the lip 290 of the showerhead 280. The skilled artisan will recognize that the bottom surface 292 of the lip 290 of the showerhead 180 is an interchangeable surface with the bottom surface 282 of the showerhead 280 positioned at a different level along the thickness of the showerhead 280. In some embodiments, the distance $D_g$ is controlled to change the mixing dynamics of gas(es) flowing through the process chamber lid 150.

Referring back to FIG. 3, some embodiments of the process chamber lid 150 include a purge ring 500. The purge ring 500 has a ring shaped body extending around the central axis 301 of the gas funnel 300. The purge ring 500 has a top surface 502 and a bottom surface 504 defining a thickness. The purge ring 500 further comprises an inner edge 506 and an outer edge 508. The bottom surface 504 of the purge ring 500 is adjacent to and in contact with the top wall 308 of the upper portion 302 of the gas funnel. As used in this manner, the term "in contact with" means that the components are physically touching, or are close enough to form a fluid tight seal, for example.

In some embodiments, at least one gas channel is formed in the bottom surface 504 and positioned over a plurality of purge channels in the lower portion of the gas funnel extending from the back surface to the contoured front surface. In some embodiments, a thermal element is a part of the purge ring 500. In some embodiments, the thermal element is a separate component from the purge ring 500. In some embodiments, the thermal element is a cooling element. The thermal element of some embodiments includes a first connection and a second connection. The first connection and second connection can be any suitable connection type depending on the type of cooling element. For example, the first connection and second connection in some embodiments are electrical connections, or are hollow tubes to allow a fluid to flow through the thermal element.

In some embodiments, the process chamber lid 150 includes a liner heater 550. The liner heater 550 is positioned on the back surface 324 of the lower portion 320 of the gas funnel 300. In some embodiments, the liner heater 550 comprises a plurality of separate segments spaced around the back surface 324 of the lower portion 320 of the gas funnel 300. In some embodiments, there are two, three, four, five, six, seven or eight separate liner heater segments. In some embodiments, all of the liner heater segments are controlled at the same time. In some embodiments, each of the segments is independently controlled.

In some embodiments, the central axis 261 of the pumping liner 250, the central axis 281 of the showerhead 280 and the central axis 301 of the gas funnel 300 are substantially coaxial and aligned with the central axis 156 of the opening 152 in the chamber lid 150. As used in this manner, the term "substantially coaxial" means that the stated axes are within the normal positioning error allowable by the equipment specification.

Referring to FIG. 6, some embodiments include a controller 495 coupled to various components of the process chamber 100 to control the operation thereof. The controller 495 of some embodiments controls the entire processing chamber (not shown). In some embodiments, the processing platform includes multiple controllers, of which controller 495 is a part; each controller configured to control one or more individual portions of the processing platform. For example, the processing platform of some embodiments comprises separate controllers for one or more of the individual processing chambers, central transfer station, factory interface and/or robots.

In some embodiments, at least one controller 495 is coupled to one or more of the process chamber lid 150, liner heater, one or more flow controller, pressure gauge, pump, feedback circuit, plasma source, purge ring 500, thermal element, or other component used for the operation of the processing chamber or process chamber lid 150, as the skilled artisan will understand.

The controller 495 may be one of any form of general-purpose computer processor, microcontroller, microprocessor, etc., that can be used in an industrial setting for controlling various chambers and sub-processors. The at least one controller 495 of some embodiments has a processor 496, a memory 497 coupled to the processor 496, input/output devices 498 coupled to the processor 496, and support circuits 499 to communication between the different electronic components. The memory 497 of some embodiments includes one or more of transitory memory (e.g., random access memory) and non-transitory memory (e.g., storage).

The memory 497, or a computer-readable medium, of the processor may be one or more of readily available memory such as random access memory (RAM), read-only memory (ROM), floppy disk, hard disk, or any other form of digital storage, local or remote. The memory 497 can retain an instruction set that is operable by the processor 496 to control parameters and components of the system. The support circuits 499 are coupled to the processor 496 for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

Some embodiments of the disclosure are directed to process chamber lids 150 and methods of processing using the process chamber lid 150 as described herein. Some embodiments of the disclosure are directed to controllers 590 having one or more configurations to execute individual processes or sub-processes to perform embodiments of the method described herein. The controller 495 can be connected to and configured to operate intermediate components to perform the functions of the methods. For example, the controller 495 of some embodiments is connected to (directly or indirectly) and configured to control one or more of gas valves, actuators, motors, access ports, vacuum control, etc. Some embodiments are directed to non-transitory computer readable medium configured to execute embodiments of the method.

In some embodiments, the controller 495, or non-transitory computer readable medium, has one or more configurations or instructions selected from: a configuration to flow a first gas through a first inlet line into a gas funnel of a gas distribution assembly; ignite a plasma of the first gas inlet; exhaust gases through a pumping liner of the gas distribution assembly; and power a liner heater to control a temperature in the pumping liner.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A gas distribution assembly comprising:
   a pumping liner comprising a cylindrical body with an open central region, the pumping liner having an inner wall, an outer wall, a top wall and a bottom wall, the inner wall slanting at a first angle relative to a central axis of the gas distribution assembly so that the inner wall adjacent the bottom wall is closer to the central axis than the inner wall adjacent the top wall;
   a showerhead having a front surface and a back surface defining a thickness with a plurality of apertures extending through the thickness, the showerhead positioned so that an outer portion of the back surface is adjacent the bottom wall of the pumping liner; and a gas funnel having an upper portion and a lower portion, the lower portion of the gas funnel positioned within the open central region of the pumping liner, the lower portion comprising a front surface, a back surface and an outer wall, the upper portion comprising an inner wall, an outer wall spaced a greater distance from a central axis of the gas funnel than the outer wall of the lower portion, a top wall and a bottom wall with a cavity in the bottom wall, the cavity having an inner cavity wall and an outer cavity wall, the lower portion having an opening extending from the back surface to the front surface, the opening formed around the central axis, the front surface having a contoured surface with an inner peripheral edge spaced an inner distance from the back surface of the showerhead and an outer peripheral edge in direct contact with the back surface of the showerhead forming a funnel gap between the front surface of the gas funnel and the back surface of the showerhead, wherein a plenum is formed between the cavity in the bottom wall of the upper portion of the gas funnel, the outer wall of the lower portion of the gas funnel and the inner wall of the pumping liner.

2. The gas distribution assembly of claim 1, wherein the showerhead comprises an inner portion and an outer portion, the plurality of apertures within the inner portion, the outer portion comprising a plurality of exhaust channels arranged in a ring around the central axis of the gas distribution assembly and extending from a front opening in the front surface to a back opening in the back surface of the showerhead.

3. The gas distribution assembly of claim 2, wherein the front opening is closer to the central axis of the gas distribution assembly than the back opening.

4. The gas distribution assembly of claim 3, wherein the front openings and back openings of the plurality of exhaust channels have the same cross-section.

5. The gas distribution assembly of claim 4, wherein the plurality of exhaust channels are slanted at the first angle.

6. The gas distribution assembly of claim 2, wherein the plurality of apertures in the inner portion of the showerhead has an outer ring of apertures spaced a distance from the outer peripheral edge of the contoured surface to prevent dead volume in the funnel gap.

7. The gas distribution assembly of claim 1, further comprising a purge ring positioned adjacent the back surface of the lower portion of the gas funnel, the purge ring having a top surface, an inner edge, an outer edge and a bottom surface, at least one gas channel formed in the bottom surface and positioned over a plurality of purge channels in the lower portion of the gas funnel extending from the back surface to the contoured front surface.

8. The gas distribution assembly of claim 7, further comprising a liner heater positioned adjacent the back surface of the lower portion of the gas funnel.

9. The gas distribution assembly of claim 1, further comprising a gas inlet connected to the back surface of the gas funnel and providing fluid communication between a gas inlet line and the opening in the back surface of the gas funnel.

10. The gas distribution assembly of claim 1, wherein a flange extends from the top wall of the pumping liner, the flange having a top wall and a bottom wall.

11. The gas distribution assembly of claim 10, wherein the top wall of the flange of the pumping liner is in contact with the bottom wall of the upper portion of the gas funnel.

12. The gas distribution assembly of claim 1, wherein the back surface of the showerhead is thermally isolated from the bottom wall of the pumping liner by at least one isolating thermal pad.

13. A processing chamber comprising:
   a chamber body having sidewalls and bottom bounding a process volume, the sidewalls having a top lip; at least one substrate support within the process volume, the at least one substrate support having a support surface; a chamber lid positioned over and in contact with the lip of the sidewalls of the chamber body; and, a gas distribution assembly comprising: a pumping liner comprising a cylindrical body with an open central region, the pumping liner having an inner wall, an outer wall, a top wall and a bottom wall, the inner wall slanting at a first angle relative to a central axis of the gas distribution assembly so that the inner wall adjacent the bottom wall is closer to the central axis than the inner wall adjacent the top wall; a showerhead having a front surface and a back surface defining a thickness with a plurality of apertures extending through the thickness, the showerhead positioned so that an outer portion of the back surface is adjacent the bottom wall of the pumping liner; and a gas funnel having an upper portion and a lower portion, the gas funnel positioned with the lower portion within the open central region of the pumping liner, the lower portion comprising a front surface, a back surface and an outer wall, the upper portion comprising an inner wall, an outer wall spaced a greater distance from a central axis of the gas funnel than the outer wall of the lower portion, a top wall and a bottom wall with a cavity in the bottom wall, the cavity having an inner cavity wall and an outer cavity wall, the lower portion having an opening extending from the back surface to the front surface, the opening formed round the central axis, the front surface having a contoured surface with an inner peripheral edge spaced an inner distance from the back surface of the showerhead and an outer peripheral edge in direct contact with the back surface of the showerhead forming a funnel gap between the front surface of the gas funnel and the back surface of the showerhead, wherein a plenum is formed between the cavity in the bottom wall of the upper portion of the gas funnel, the outer wall of the lower portion of the gas funnel and the inner wall of the pumping liner.

14. The processing chamber of claim 13, wherein the showerhead comprises an inner portion and an outer portion, the plurality of apertures within the inner portion, the plurality of apertures positioned over the support surface.

15. The processing chamber of claim 14, wherein the plurality of apertures in the inner portion of the showerhead has an outer ring of apertures positioned beyond a substrate positioned and in contact with the support surface.

16. The processing chamber of claim 13, wherein a flange extends from the top wall of the pumping liner, the flange having a top wall and a bottom wall, the bottom wall positioned adjacent to and in contact with a top wall of a chamber lid.

17. The gas distribution assembly of claim 1, wherein an outer peripheral edge of the showerhead is thermally isolated from a chamber lid by a gap, and the back surface of the showerhead is thermally isolated from the bottom wall of the pumping liner.

18. The gas distribution assembly of claim 13, wherein an outer peripheral edge of the showerhead is thermally isolated from a chamber lid by a gap, and the back surface of the showerhead is thermally isolated from the bottom wall of the pumping liner.

* * * * *